US005970167A

United States Patent [19]
Colvin

[11] Patent Number: 5,970,167
[45] Date of Patent: Oct. 19, 1999

[54] INTEGRATED CIRCUIT FAILURE ANALYSIS USING COLOR VOLTAGE CONTRAST

[75] Inventor: James Barry Colvin, Fremont, Calif.

[73] Assignee: Alpha Innotech Corporation, San Leandro, Calif.

[21] Appl. No.: 08/744,372

[22] Filed: Nov. 7, 1996

Related U.S. Application Data

[60] Provisional application No. 60/006,368, Nov. 8, 1995.

[51] Int. Cl.[6] ................................................. G06K 9/00
[52] U.S. Cl. ........................... 382/149; 382/165; 348/93
[58] Field of Search ............................... 382/141, 145, 382/149, 162, 165; 348/86, 87, 92, 93, 125, 130, 128, 162; 356/237, 374, 376; 250/309–311; 178/6, 8

[56] References Cited

U.S. PATENT DOCUMENTS

| | | | |
|---|---|---|---|
| 1,889,794 | 12/1932 | Sabel | 359/829 |
| 3,716,999 | 2/1973 | Middelbeek | 61/48 |
| 3,916,439 | 10/1975 | Lloyd et al. | 348/130 |
| 4,025,171 | 5/1977 | Peck | 350/255 |
| 4,164,461 | 8/1979 | Schilling | 204/192 EC |
| 4,208,101 | 6/1980 | Trapp et al. | 350/175 ML |
| 4,357,203 | 11/1982 | Zelez | 156/643 |
| 4,358,732 | 11/1982 | Johnston et al. | 324/73 R |
| 4,556,317 | 12/1985 | Sandland et al. | 356/237 |

(List continued on next page.)

OTHER PUBLICATIONS

J. Colvin, "Color Voltage Contrast: A New Method of Implementing Fault Contrast With Color Imaging Software", International Symposium for Testing and Failure Analysis, Nov. 1995.

J. Colvin, "The Identification of Compromised Oxide Interfaces Using Noise Signature Techniques From a Constant Current Source", Proceedings of the 20th International Symposium for Testing and Failure Analysis, Nov. 13–18 1994.

L. Baker et al., "A Simplified Application Of A Slow Scan CCD 'Astronomy' Camera To Emission Microscopy And Fluorescent Microthermography", The 20th International Symposium for Testing & Failure Analysis, Nov. 13–18 1994.

The Micromanipulator Co. Inc., Model 8800 Series TEMPSEAL and DRYER SYSTEM, product brochure, (no date).

"Hypervision—The Leader in Emission Microscopy", Hypervision Corporation, (no date).

*Primary Examiner*—Christopher S. Kelley
*Attorney, Agent, or Firm*—Haverstock & Owens LLP

[57] ABSTRACT

A method and apparatus for analyzing failures in integrated circuits. A first image is obtained using an emission or electron microscope while an integrated circuit is operating under a first set of conditions. The image is integrated for improved resolution with a camera in front of the microscope screen or with a digitizer coupled to receive video signals from the microscope. The first image is digitized and stored in a first channel of an RGB digitizer board and displayed on a display screen. A second image is obtained in the same way and is digitized and stored in a second channel of the RGB digitizer board and displayed on the display screen. The remaining channel of the RGB digitizer board is coupled to receive live images. The resulting combined image appears as a black and white image so long as the images are aligned. Any differences between the three images will appear conspicuously in color. The input logic levels to the integrated circuit are changed. Nodes having changed logic levels will appear in color in the display because they will only affect the third channel. In addition, the displayed image will simultaneously show nodes which have not changed states in different shades of grey depending upon the unchanged logic level. The displayed image may then be compared to a previously obtained reference image from an integrated circuit known to not have any defects. Any differences between the two images will indicate the exact location of a failure or defect.

31 Claims, 11 Drawing Sheets

U.S. PATENT DOCUMENTS

| | | | |
|---|---|---|---|
| 4,618,938 | 10/1986 | Sandland et al. | 364/552 |
| 4,680,635 | 7/1987 | Khurana | 358/211 |
| 4,722,298 | 2/1988 | Rubin et al. | 118/715 |
| 4,755,874 | 7/1988 | Esrig et al. | 358/106 |
| 4,772,846 | 9/1988 | Reeds | 324/158 F |
| 4,811,090 | 3/1989 | Khurana | 358/93 |
| 5,035,768 | 7/1991 | Mu et al. | 156/626 |
| 5,059,785 | 10/1991 | Doyle et al. | 250/309 |
| 5,296,704 | 3/1994 | Mishima et al. | 250/306 |
| 5,301,006 | 4/1994 | Bruce | 356/311 |
| 5,475,316 | 12/1995 | Hurley et al. | 324/750 |

INTEGRATED CIRCUIT FAILURE ANALYSIS USING COLOR VOLTAGE CONTRAST

This application claims the benefit of U.S. Provisional Application No. 60/006,368, filed Nov. 8, 1995.

FIELD OF THE INVENTION

This invention relates to the field of integrated circuit failure analysis of integrated circuits. More particularly, the invention relates to integrated circuit failure analysis using color voltage contrast for failure analysis of integrated circuits.

BACKGROUND OF THE INVENTION

It is well known that in integrated circuit operation, fault conditions or failures can cause extremely faint photon emissions. These photon emissions can be detected by an emission microscope such as the one described in U.S. Pat. No. 4,680,635 to Khurana. Co-pending U.S. patent application Ser. No. 08/555,186 discloses a workstation for analyzing IC fault conditions. Images obtained which show faults or failures based upon the resulting emissions are referred to as fault contrast images.

It is also well known that during integrated circuit operation, an electron microscope can detect differing logic levels of a node in an integrated circuit. For example, a node which is at +5 volts will tend to absorb electrons emitted from an electron microscope (appearing dark in a black and white image), whereas, a node which is at 0 volts will tend to reflect electrons emitted from the electron microscope (appearing light in a black and white image). Therefore, an image obtained will depend upon the voltage levels at the various nodes of the integrated circuit. This is referred to as voltage contrast imaging. U.S. Pat. No. 4,772,846 to Reeds discloses an apparatus for chip testing by voltage contrast electron microscopy.

A method of failure analysis using voltage contrast imaging utilizes image subtraction. Image subtraction involves obtaining a first voltage contrast image of an integrated circuit operating under a first set of input conditions, then obtaining a second voltage contrast image of the integrated circuit operating under a second set of input conditions. Then, one image is subtracted from the other image. The subtraction operation may be performed by storing each image in digital form and then using software to perform the subtraction operation on corresponding pixels from each image. The resulting image is representative of nodes of the integrated circuit that changed logic levels when the first set of inputs changed to the second set of inputs; any part of the integrated circuit which did not change logic levels will be removed from the resulting image by the subtract operation. The resulting image, however, suffers from a drawback in that only one direction of logic change is represented. For example, if the node is at a high logic level (absorbs electrons) in the first image and is at a low logic level in the second image (reflects electrons) and the first image is subtracted from the second image, the node will appear to have changed states. However, if a node is at a low logic level (reflects electrons) in the first image and is at a high logic level in the second image (absorbs electrons) and the first image is subtracted from the second image, the node will not appear to have changed states. This is because subtracting the image representing the reflected electrons (a light area in the black and white image) will not affect the appearance of the already dark node in the resulting image.

Alternately, the first image and the second image may be combined using the exclusive OR operation. The resulting image will then show logic changes in both directions. However, both of these methods suffer from the drawback that the resulting image does not show the logic states of unchanged nodes. When tracking failures such as a saturated transistor resulting from a logic short somewhere else, all logic states, both static and transitional, need to be represented simultaneously in order to perform an expedient analysis.

Therefore, what is needed is a method and apparatus for failure tracking and analysis that does not suffer from the above described drawbacks.

SUMMARY OF THE INVENTION

The present invention provides an improved method and apparatus for tracking and analyzing failures in integrated circuits. A first image is obtained using an emission microscope or an electron microscope while an integrated circuit is operating under a first set of input conditions. The image is integrated over a period of time to improve its resolution by placing a black and white camera in front of the microscope screen as the microscope is receiving the live image from the integrated circuit. Alternately, a digitizing card having a capability of integrating frames over a period of time is coupled to the video output of the microscope. The first image is then digitized, stored, and coupled to a first channel of an RGB digitizer board (either the red channel, the green channel, or the blue channel; for this example, the blue channel) and displayed on a display screen. Then, a second image is obtained in the same way using the first set of input conditions. The second image is then digitized, stored, and coupled to a second channel of the RGB digitizer board (one of the two remaining channels; for this example, the green channel) and displayed on the display screen. Then, the system is configured so that the remaining channel of the RGB digitizer board receives live images from the integrated circuit (in this example, the red channel).

Because each of the three images are identical in grey scale, then mapped to each of the three color channels in the RGB digitizer board before being combined into a single image, the resulting image will appear on the display to be a black and white image so long as the images are aligned. However, any differences between the three images will appear in color. Because the differences appear in color in an image which is primarily black and white, the differences will be conspicuous.

Then, the input logic levels to the integrated circuit may be changed, causing the various nodes of the chip to respond by changing logic levels. These nodes having changed logic levels will appear in color in the display because they will only affect the third channel. For example, since the third channel is red, a node which switches from +5 to ground will appear in the displayed image as red; a node which switches from ground to +5 volts will appear in the displayed image as blue-green (having less red). Nodes which do not change logic levels will appear in the display as black and white, which level will depend upon the logic state (nodes at +5 volts will appear darker than nodes at ground level).

Therefore, the displayed image will show nodes which changed logic states in a different colors depending upon the direction of change. In addition, the displayed image will simultaneously show nodes which have not changed states in different shades of grey depending upon the unchanged logic level. The displayed image may then be compared to a previously obtained reference image from an integrated circuit known to not have any defects. Any differences between the two images will indicate the exact location of a failure or defect.

BRIEF DESCRIPTION OF THE DRAWINGS

The file of this patent contains at least one drawing executed in color. Copies of this patent with color drawing (s) will be provided by the Patent and Trademark Office upon request and payment of the necessary fee.

DETAILED DESCRIPTION OF THE PREFERRED EMBODIMENT

While describing the invention and its embodiments, certain terminology will be utilized for the sake of clarity. It is intended that such terminology not limit the scope of the invention. Therefore, the invention includes all technical equivalents which perform substantially the same function, in substantially the same manner to achieve substantially the same result.

Figure 1:
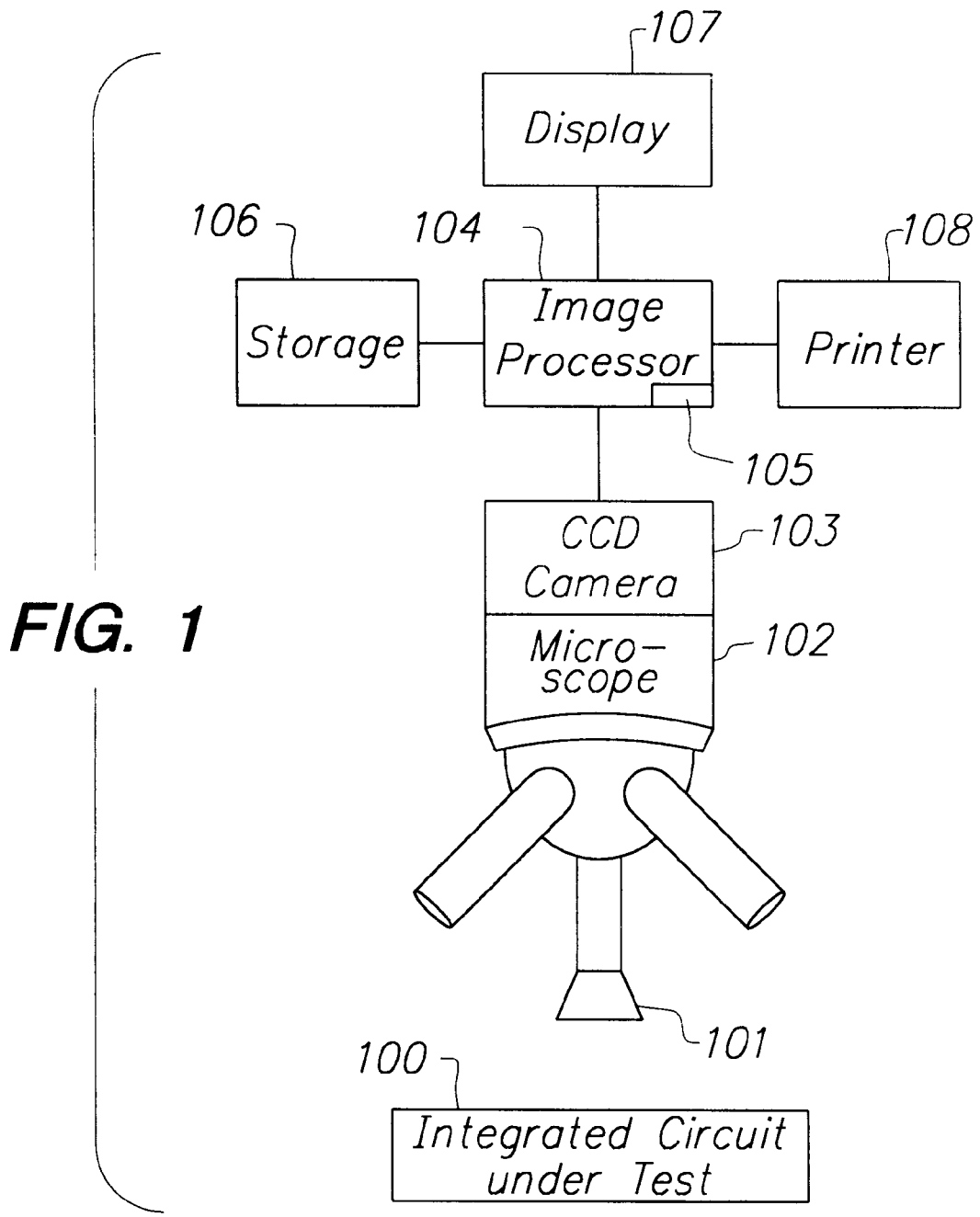
FIG. 1 illustrates a block diagram of a first embodiment of the present invention utilizing an emission microscope as an image source.

FIG. 1 illustrates a block diagram of a first embodiment of the present invention. A small light tight box 100 houses an integrated circuit to be tested. A rubber boot 101 is fitted over an aperture in the box 100 to further shield the circuit from any extraneous light. This rubber boot 101 is ideally constructed of a collapsible soft rubber which facilitates a tight fit and retractability for test insertion and magnification change. Although this is the ideal construction, other types of construction can be implemented.

Figure 2:
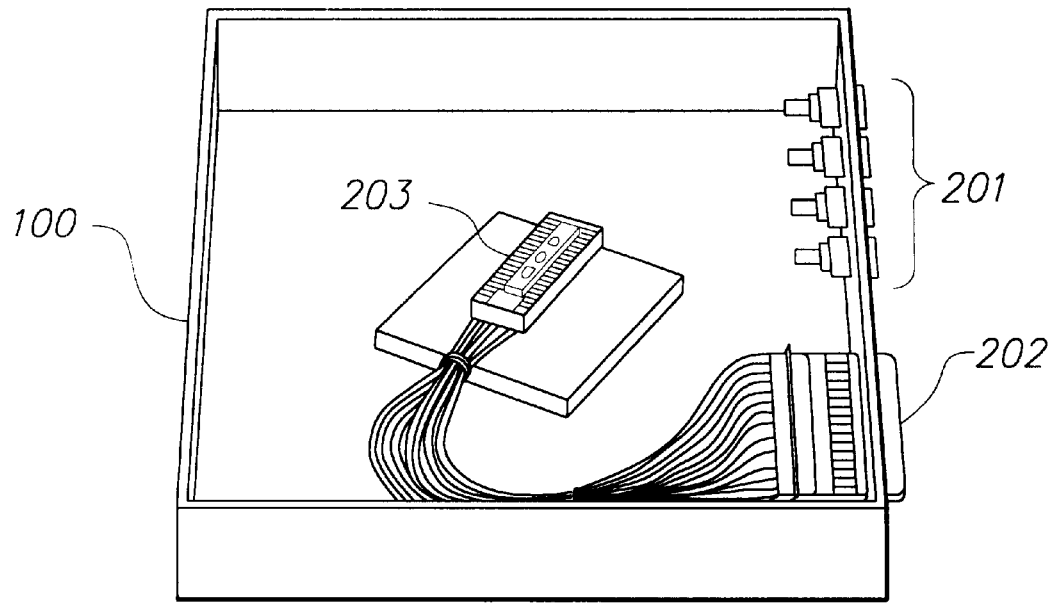
FIG. 2 illustrates a small light tight box with its cover removed.
Figure 3:
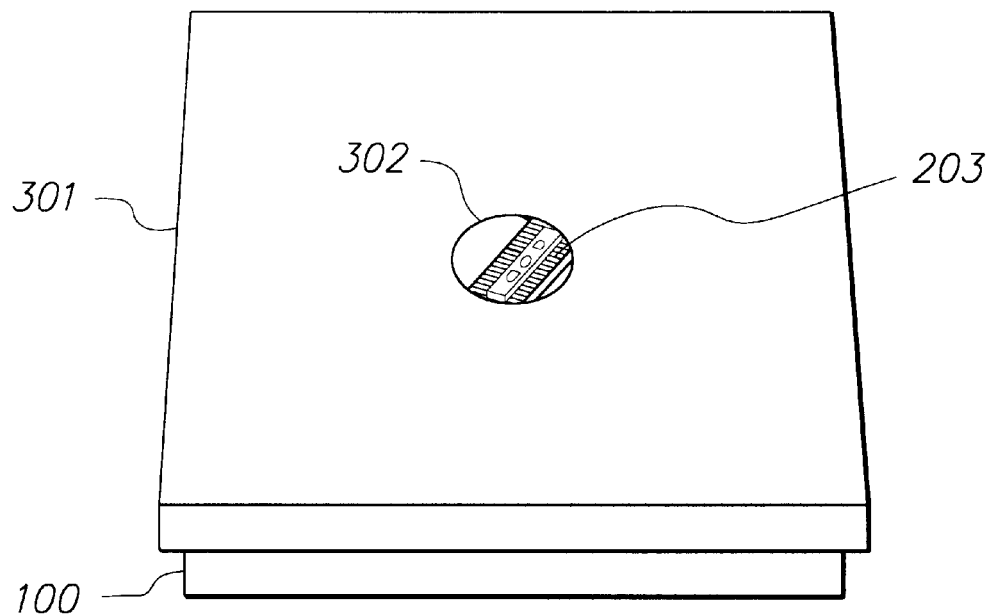
FIG. 3 illustrates the small light tight box with the cover in place.

FIG. 2 illustrates the small light tight box 100 with its cover removed. Coupled to the box 100 are banana plugs 201 and pin connector 202 which provide access to the circuit 203. FIG. 3 illustrates the small light tight box 100 with the cover 301 in place. An aperture 302 is located in the cover for allowing the microscope optics 103 to view the circuit 203.

Preferably, the light tight box 100 or the rubber boot 101 contains a light source for illuminating the integrated circuit under test. The light source could comprise one or more LEDs or a fiber optic light source.

Referring to FIG. 1, the rubber boot 101 is coupled to a microscope 102 which allows for varying magnifications of the circuit. The microscope 102 is preferably an emission microscope, but may be an electron beam microscope (as described in reference to FIGS. 4–5). A camera 103 is coupled to the microscope optics 102 and allows for high resolution image of the circuit. The camera 103 is preferably a charge coupled device (CCD) camera because conventional cameras produce heat which tends to introduce noise and interference into the image. Cooling of the CCD camera 103 is optional.

An image processor 104 is coupled to the CCD camera 103 and processes the received images. The image processor 104 includes a RGB digitizer board 105. The image processor 104 is capable of not only digitizing the received image, but it is also capable of performing other processing functions. These functions include, but are not limited to, image enhancement, noise filtering and superimposing images to obtain a composite image. The image processor also includes software for performing these functions.

A storage means 106 is coupled to the image processing computer 106 for storing the aforementioned images. This storage means 106 includes not only fixed storage mediums such as a hard drive, but also disk drives and tape drives which allow for potentially unlimited storage capacity. Finally, the images may be viewed by a user in one of two formats. It may either be viewed on a display 107, such as a cathode ray tube monitor, or it may be printed on a printer 108.

Figure 4:
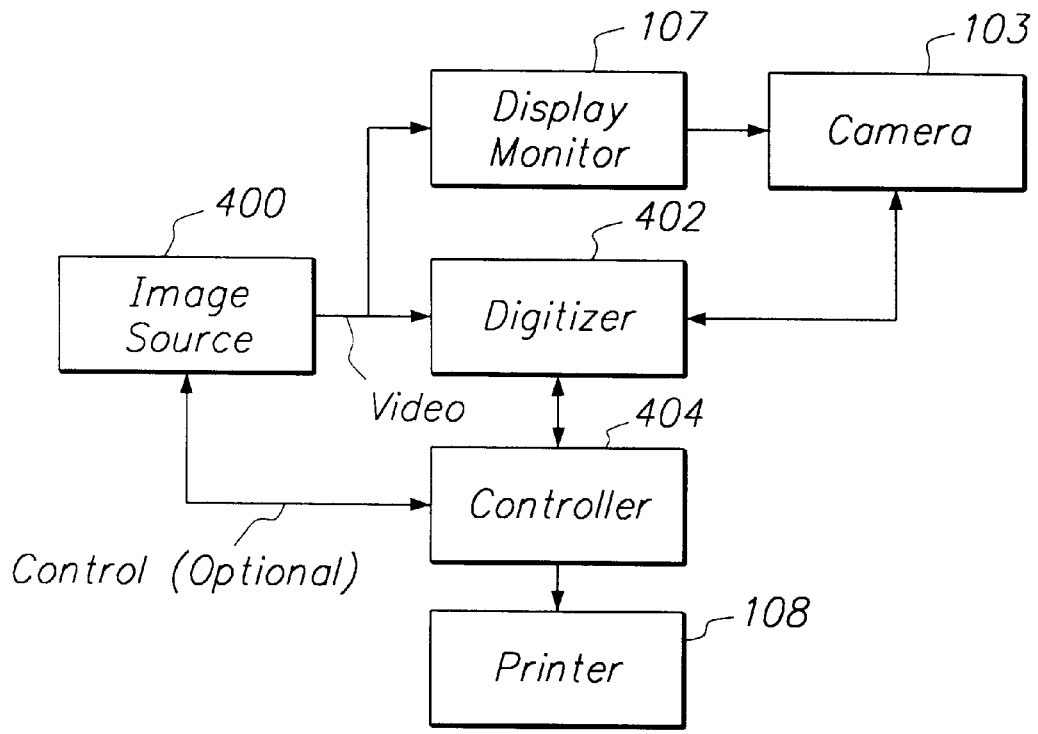
FIG. 4 illustrates a second embodiment of the present invention utilizing a CCD camera and/or a digitizer card.

FIG. 4 illustrates a second embodiment of the present invention utilizing an electron microscope and a digitizer board. An image source 400, such as a scanning electron microscope, an electron-beam probe (Ebeam probe), or other video source, provides a video signal representative of an image to be compared to another image. The video signal can be then be applied to a digitizer board 402, having red, green and blue channels. A first image can be stored in a first channel of the digitizer board and displayed by the monitor 107. A second image can be stored in a second channel of the digitizer board 402 and displayed by the monitor 107. A third image can be stored in a third channel of the digitizer board 402 and displayed by the monitor 107. Though the camera 103 is not required, a photo of the display screen of the monitor 107 can be made by the camera 103.

In an alternate embodiment of the invention illustrated in FIG. 4, the video signal is provided directly to a display monitor 107. A first image can be displayed by the monitor 107, recorded by the camera 103 and stored in a first channel of the digitizer board 402. A second image can be displayed by the monitor 107, recorded by the camera 103 and stored in a second channel of the digitizer board 402. A third image can be displayed by the monitor 107, recorded by the camera 103 and stored in a third channel of the digitizer board 402. Then, the combined image stored by the digitizer board 402 can be displayed by the monitor 107. Differences between the images will be highlighted in color on the display screen of the monitor 107.

The camera 103 eliminates the need for compatible scan rates between systems and allows an image to be integrated over time by adjusting the exposure time. The camera can be any means for producing an image of a display screen. For example, the camera can be charge coupled device (CCD) camera, a vidicon camera, an image intensified camera or a conventional camera. Also, photographic films with color filters can be used.

A controller 404 is coupled to control the digitizer 402 and is optionally coupled to control the image source 400. In addition, the controller 404 can receive images from the camera 103 and can provide the images to a printer 108 or other device for making hard copies of the images. Alternately, the display monitor 107 can be omitted and a monitor included in the image source 400 can be utilized. In the preferred embodiment, the image source is a Hitachi model number S-2500 SEM (scanning electron microscope). It will be apparent that the image source can be any source of images.

Figure 5:
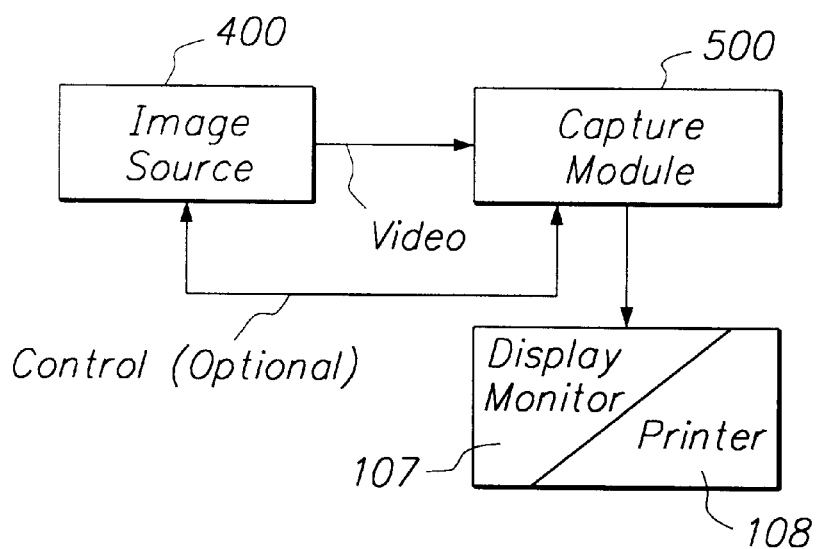
FIG. 5 illustrates a third embodiment of the present invention utilizing a digitizing capture module having integration capability.

FIG. 5 illustrates a third embodiment of the present invention utilizing a digitizing capture module 500 having integration capability. The image source 400 is coupled to provide a video signal to the capture module 500. The capture module 500 is optionally coupled for control to the image source 400. In addition, a display monitor 107 and/or printer 108 is coupled to receive images from the capture module 500 for providing a visual display and/or hard copy of the images.

The capture module 500 receives a first image from the image source 400, and stores the image in a first color channel. A second image from the image source 400 is stored in a second color channel. A third image from the image source 400 is stored in a third color channel. A display monitor 107 can be coupled to display the three color channels simultaneously such that differences in the images are highlighted in color. In addition, a printer 108 can be coupled to produce a hard copy illustrating differences in the images highlighted in color.

The image source 400 can be an electron microscope and the capture module 500, can be a digital capture module available under the model name "Genie" from Semicaps, Inc., which is located at 2116-B Walsh Avenue, in Santa Clara, Calif. The Semicaps product has an ability to ensure that scan rates between the electron microscope and the digitizing portion are compatable. Alternately, the image source 400 and capture module 500 can be combined in an Ebeam probe, which includes an electron microscope, available under model numbers IDS 3000, IDS 5000 or IDS 10,000 from Schlumberger Technologies, located at 1601 Technology Drive, in San Jose, Calif. The Schlumberger product includes both an electron microscope and a digitizer having compatible scan rates. Because the above-listed capture modules typically include a black and white digitizer, the black and white digitizer is replaced with a color digitizer having red, green and blue channels and appropriate modifications are made to the operating software of the capture module as required by the addition of the color digitizer.

Refer to FIGS. 4 and 5 and assume, for example, that the image source 400 is a scanning electron microscope and that the CCD camera 103 is utilized. A first image of an integrated circuit is obtained by the electron microscope while the integrated circuit is operating under a first set of input logic conditions. The CCD camera 103 is placed in front of the electron microscope in order to capture the voltage contrast or color capacitive coupling voltage contrast events. The first image is integrated to improve its resolution by exposing the CCD camera 103 to the electron microscope screen as the electron microscope is receiving the live image from the integrated circuit.

The camera 103 eliminates a possible problem of making the scan rates compatible between the electron microscope and the other elements of the invention which can occur if the RGB digitizer board is limited in its scan rate compatibility. The camera 103 also serves as the integrator. Integration averages noise during the period of time during which the video is captured. This allows for rapid image production and improved resolution of the images. Preferably, the CCD camera 103 is a black and white (monochrome) 768×494 pixel CCD camera using the RS-170 video format. A 12.5 mm television lens with adjustable aperture can be used to control the exposure. A zoom lens with an adjustable aperture can also be used. Alternately, the digitizer 402 or capture module 500 having an ability to integrate the image over time can be utilized in place of the camera 103 to capture the events.

Figure 6:
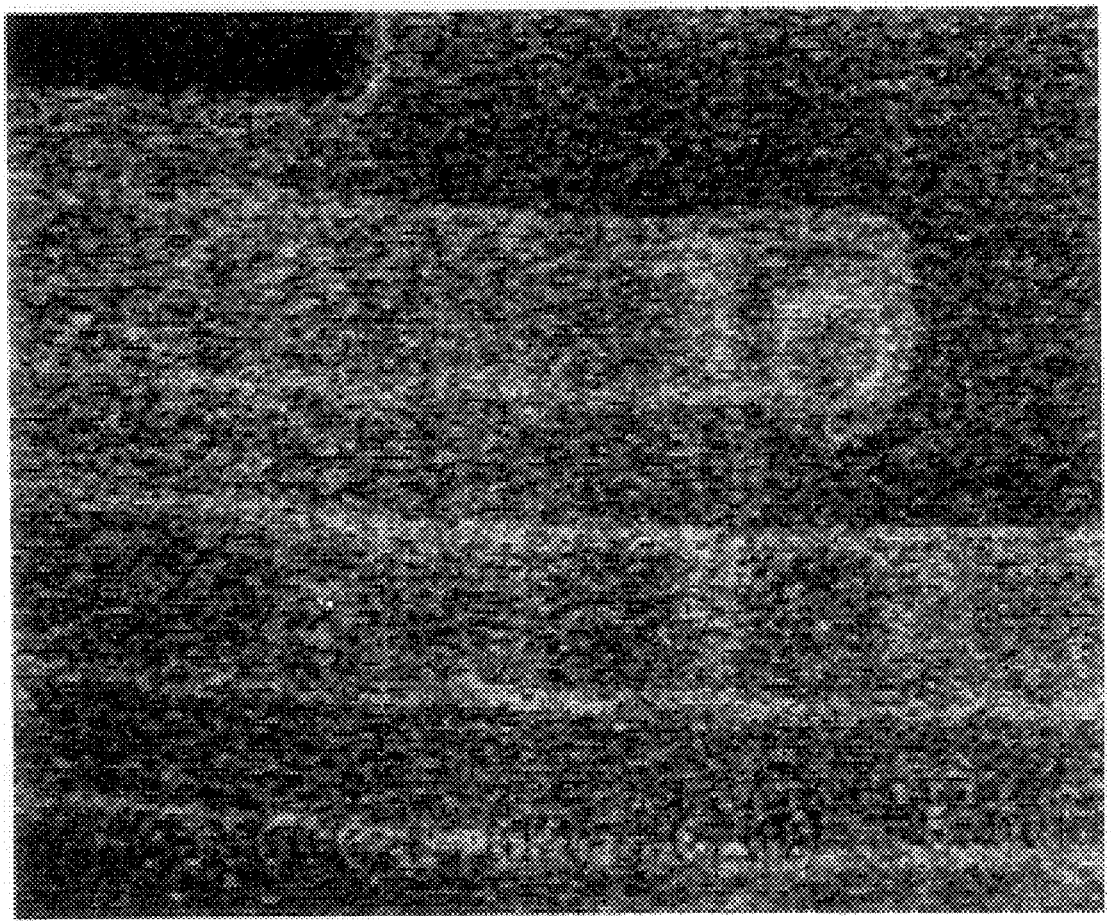
FIG. 6 illustrates an image obtained from the microscope screen with a camera integration period of ½ second.
Figure 7:
FIG. 7 illustrates an image obtained from the microscope screen having a camera integration period of 10 seconds.

FIG. 6 illustrates an image obtained from the microscope screen with a camera integration period of ½ second. FIG. 7 illustrates an image obtained from the microscope screen having a camera integration period of 10 seconds. It can be seen that the image in FIG. 7 is more clearly defined than the image shown in FIG. 6, the image shown in FIG. 7 having an improved signal-to-noise ratio over the signal-to-noise ratio of the image shown in FIG. 6. Since scan and integration rates can be independently controlled, the more rapid scan rates used for color capacitive coupling voltage contrast (described below) can be made compatible for comparing such images with color voltage contrast images (described below).

Color capacitive coupling voltage contrast allows conductors under oxide to be imaged due to the capacitive coupling of the electron beam and underlying conductor. Color voltage contrast reveals information as to the bias potential of conductors. The technique is preferably implemented with passivation removed and accelerating voltages of 2 KV or less, however, imaging is possible with passivation at higher beam energies due to the conductive interaction volume generated by the electron beam.

A conductor at ground potential will release more secondary electrons than a conductor at +5 volts. This results in a contrast difference in the secondary electron image. Color voltage contrast is accomplished by storing the static voltage contrast image information in one or two of the three primary color channels and acquiring dynamic voltage contrast information into another primary color channel.

After integration of the first image by the camera 103, the first image is then received by the capture module 500 (FIG. 5) or by the digitizer 402 and controller 400 (FIG. 4). The first image is digitized and stored in a first channel of an RGB digitizer board within the digitizer 402 or capture module 500 (either the red channel, the green channel, or the blue channel; for this example the blue channel) and displayed on a display screen 107. Then, a second image is obtained in the same manner using the first set of input conditions. The second image is then digitized and stored in a second channel of the RGB digitizer board (one of the two remaining channels; for this example, the green channel) and displayed on the display screen 107. Then, the system is configured so that the remaining channel of the RGB digitizer board receives live voltage contrast images from the integrated circuit (in this example, the red channel).

Because each of the three images are identical in grey scale, then mapped to each of the three color channels of the RGB digitizer board before being combined into a single image, the resulting image will appear on the display 107 to be a black and white image so long as the images are aligned. However, any differences between the three images will appear in color. Because the differences appear in color in an image which is primarily black and white (monochrome), the differences will be conspicuous.

Then, the input logic levels to the integrated circuit may be changed, causing the various nodes of the chip to respond by changing logic levels. The nodes having changed logic levels will appear in color in the display because they will only affect the third channel. For example, since the third channel is red, a node which switches from +5 to ground will appear in the displayed image as red (designated "R"); a node which switches from ground to +5 volts will appear in the displayed image as blue-green (having less red). Nodes which do not change logic levels will appear in the display as black and white, which level will depend upon the logic state (nodes at +5 volts will appear darker than nodes at ground).

Figure 8:
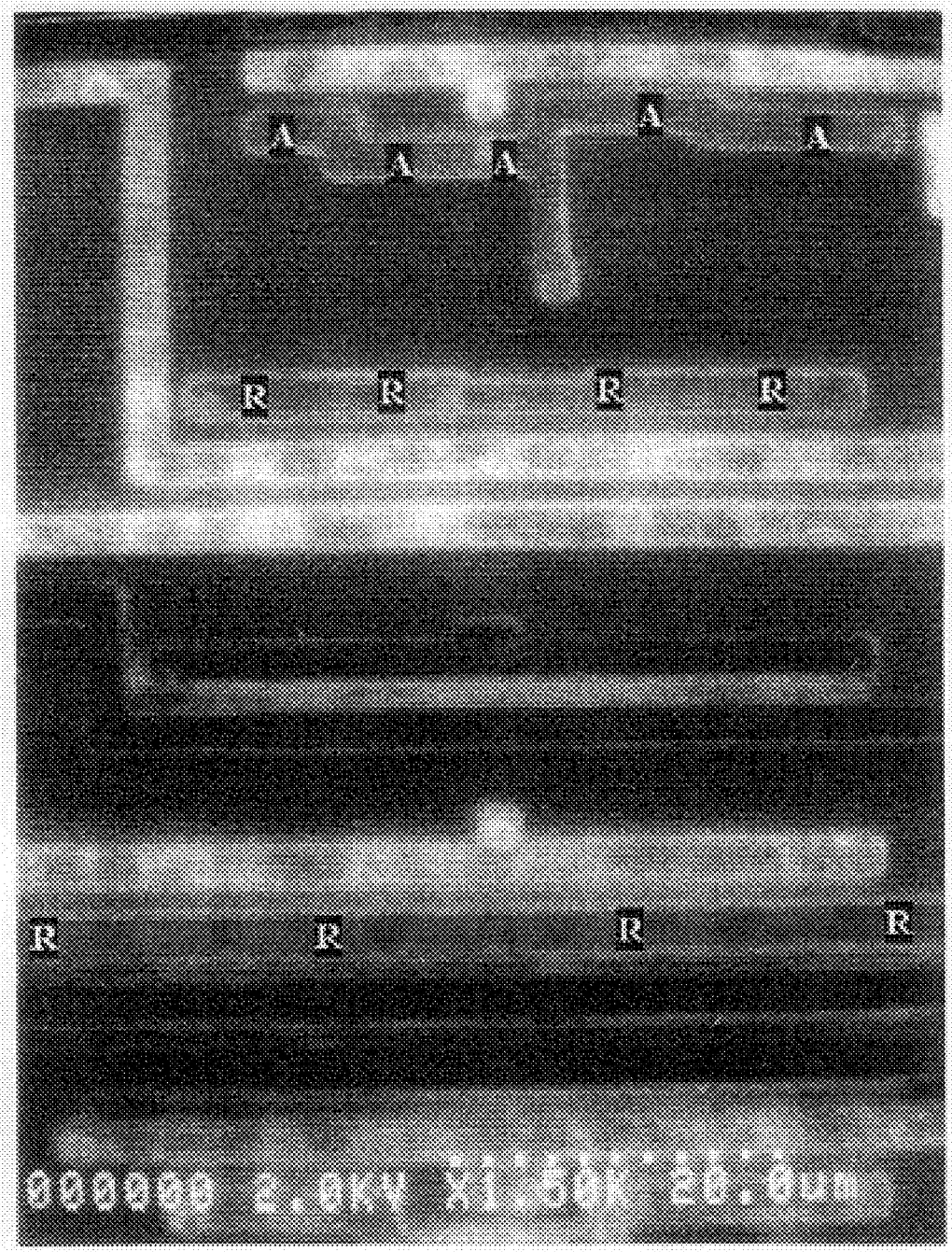
FIG. 8 illustrates a first image formed using color voltage contrast.

Two or three color channels can be used to present sequential logic changes by changing color channels at key points in the logic algorithm or by loading three different logic states into each of the three primary color channels. FIG. 8 illustrates an image formed using color voltage contrast ("R"=red, "A"=aqua). In FIG. 8, two of the three color channels receive the same image, while logic inputs to the integrated circuit are changed to obtain an image coupled to the third color channel. The resultant image shown in FIG. 8 was obtained by loading the blue and green channels with a voltage contrast image obtained with the reset pin held high and loading the red channel with a voltage contrast image obtained with the reset pin held low.

In FIG. 8, nodes which experienced no logic changes are represented as white=ground and black=+5 volts. Nodes which are aqua colored are the result of a loss of red when the reset pin was switched low. These nodes are now at +5 volts. Nodes which are red are result of a gain of red when the reset pin was switched low. These nodes are now at ground.

Figure 9:
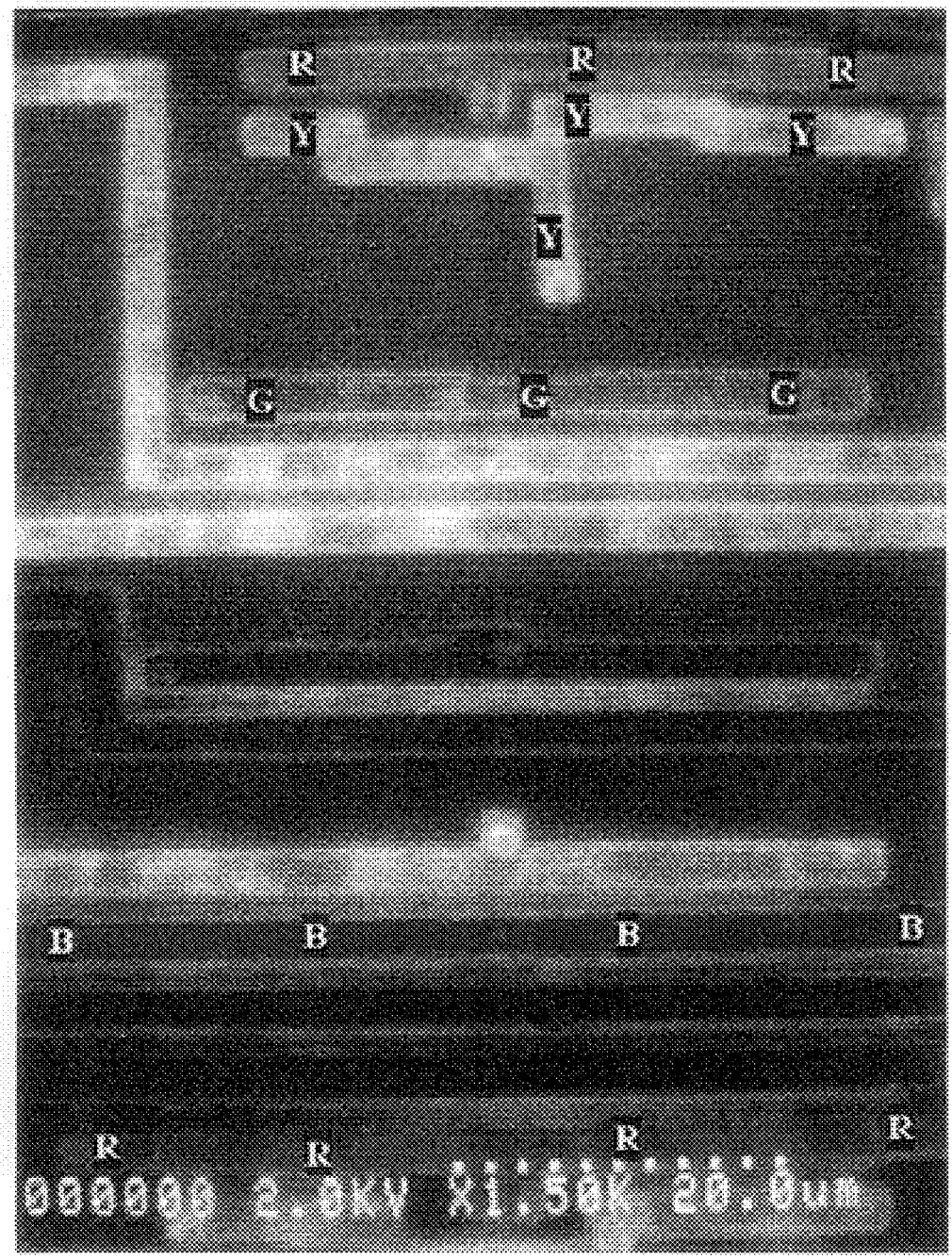
FIG. 9 illustrates a second image formed using color voltage contrast.

FIG. 9 illustrates another image formed using color voltage contrast ("G"=green, "Y"=yellow, "B"=blue, "R"=red). In FIG. 9, a different set of logic inputs have been applied to the integrated circuit to obtain each of the three images stored in the primary color channels. The resultant image shown in FIG. 9 was obtained by loading the red channel with a voltage contrast image obtained with the integrated circuit reset pin held high and the chip select pin held low, loading the green channel with a voltage contrast image obtained with the reset pin held high and the chip select pin held high, and loading the blue channel with a voltage contrast image obtained with reset held low and chip select held high.

In FIG. 9, nodes which are red represent a logic transition to ground only when the reset pin is held high and the chip select pin is held low. Nodes which are green are the result of a logic transition to ground only when the reset pin is high and the chip sect pin is high. Nodes which are blue are a result of a logic transition to ground only when the reset pin is low and the chip select pin is high. The yellow node is a result of a logic transition to +5 when the reset pin is low and the chip select pin is high (yellow is green plus red minus blue).

Therefore, the displayed image will simultaneously show nodes which changed logic states in a different colors depending upon the direction of change and the displayed image will show nodes which have not changed states in different shades of grey depending upon the unchanged logic level. The displayed image may then be compared to a previously obtained reference image from an integrated circuit known to be defect free. Any differences between the two images will indicate the exact location of a failure.

In addition, one of the three images stored in a channel of the RGB digitizer board may be may be obtained from a integrated circuit chip that is different from the integrated circuit used to obtain the other images. For example, an image from an integrated circuit known to not have any defects may be stored in the red channel and images from a circuit under test may be stored in each of the blue and green channels. It will be apparent that the selection of channels can be varied. In this example, the operating conditions of both integrated circuits should be the same. When the images are aligned, the resultant image should be black and white. If any color appears, then it will be readily apparent that there is a difference between the integrated circuits, indicating that the integrated circuit under test suffers from a defect. This technique can be used with both voltage contrast and fault contrast images.

Figure 10:
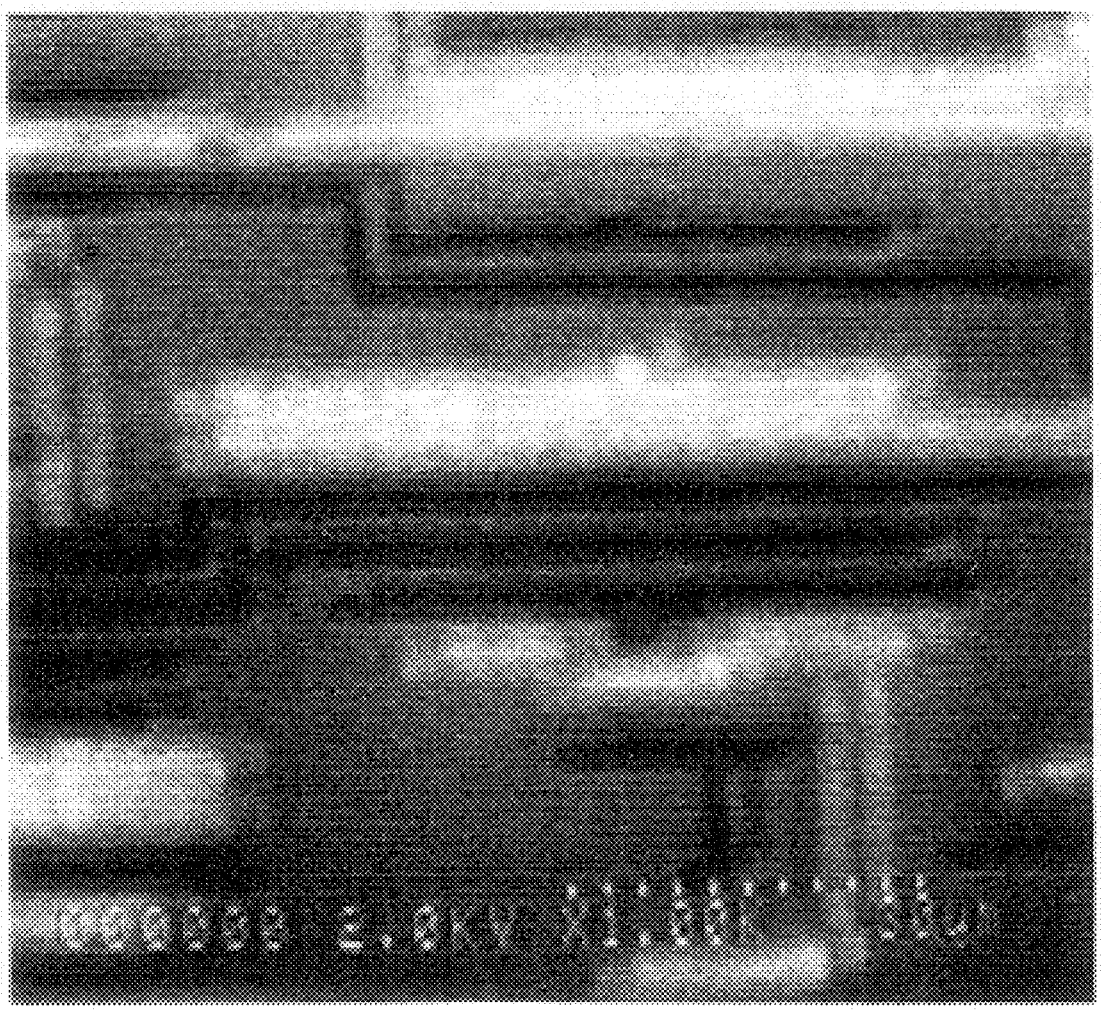
FIG. 10 illustrates an image obtained during the alignment process of images from different integrated circuits.

A difficulty associated with comparisons between different integrated circuits is obtaining proper alignment of the images. Alignment is simplified by using color convergence alignment. This is accomplished by storing an image from a first integrated circuit in two channels of the RGB board, then routing a live image of a second integrated circuit to the RGB board. Then the image from the second integrated circuit is maneuvered into alignment with the images from the first integrated circuit. When the images are not aligned, the resultant image will be streaked with color as shown in FIG. 10 which illustrates an image obtained during the alignment process of images from different integrated circuits. When the images are aligned, the resultant image will be in black and white (except for any defects in the integrated circuits or differences between the images obtained from each integrated circuit).

Figure 11:
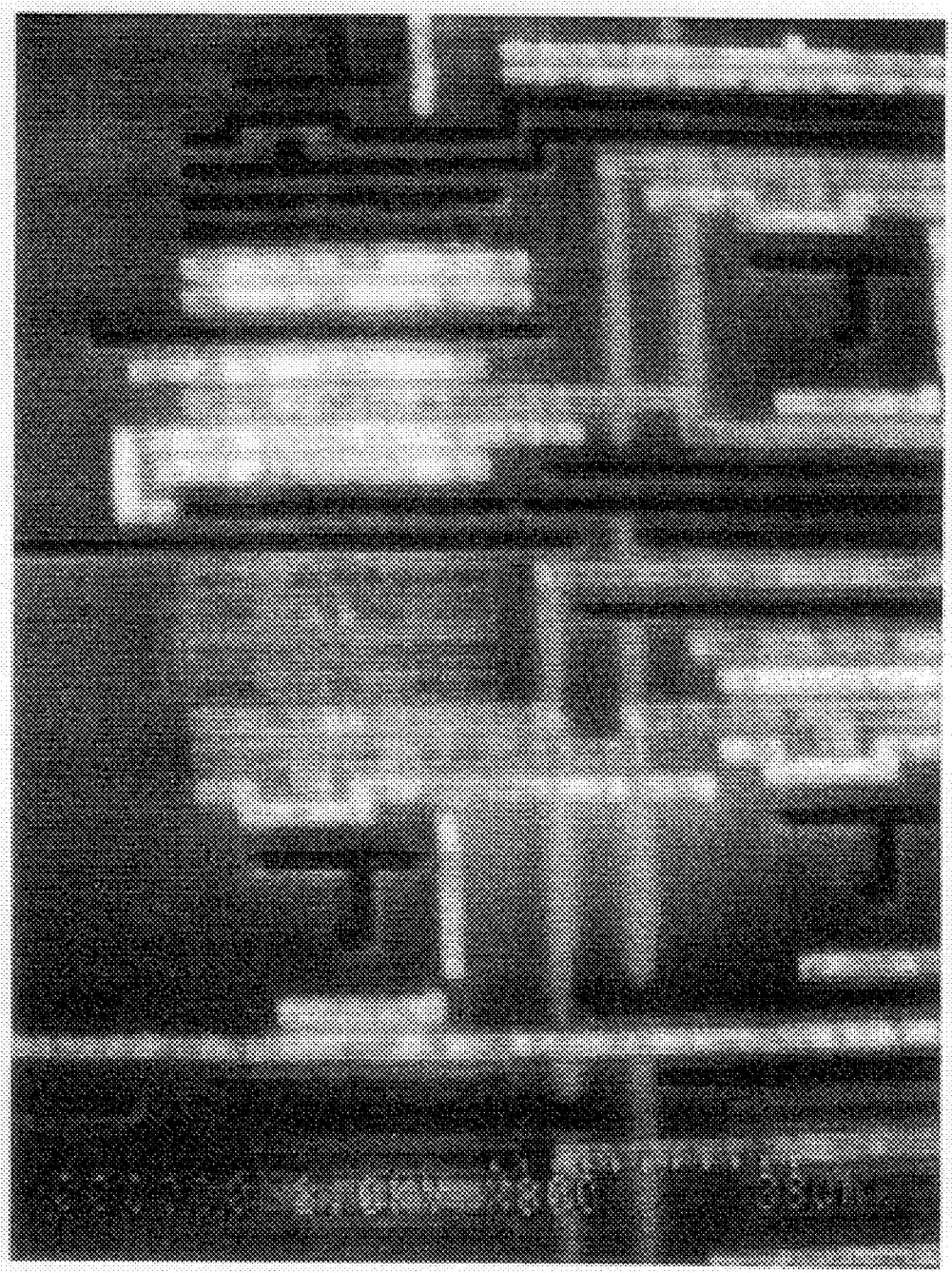
FIG. 11 illustrates an image formed using capacitive coupling voltage contrast.

Color capacitive coupling voltage contrast allows conductors under oxide to be imaged due to capacitive coupling of the electron beam to the underlying conductor. If the underlying conductor experiences a logic state transition, the surface equilibrium of the oxide will be locally changed. The beam scan will restore equilibrium as a function of time and energy imparted to the affected area. The scan area, the beam current, and oxide thickness affect the decay time during which the event is observable by the microscope. Dynamic imaging is accomplished by toggling an input or control pin. An image obtained using capacitive coupling voltage contrast is shown in FIG. 11.

Figure 12:
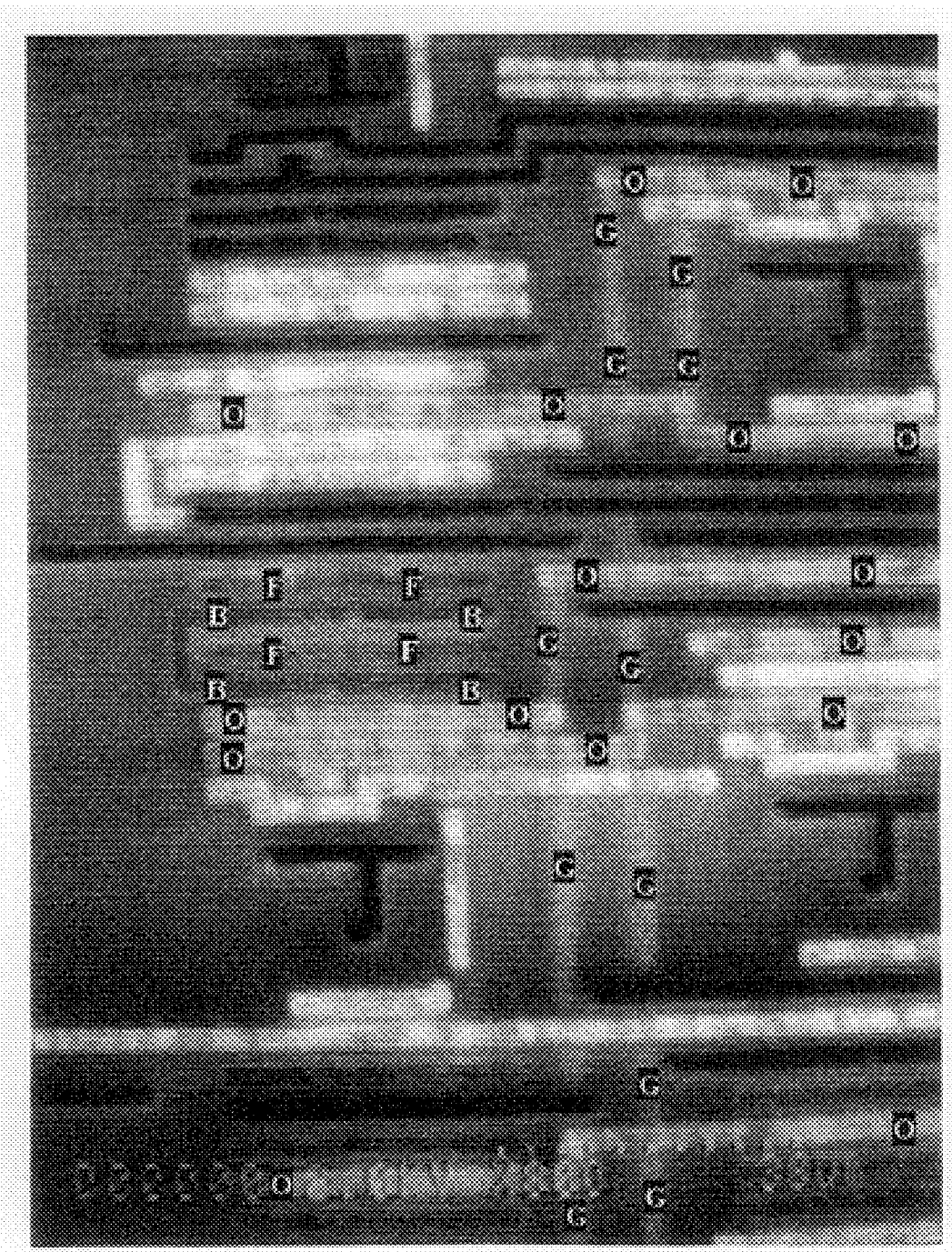
FIG. 12 illustrates an image formed using color capacitive coupling voltage contrast.

FIG. 12 illustrates an image formed using color capacitive coupling voltage contrast ("G"=green, "O"=orange, "B"= aqua+blue, "F"=floating node). In this case, the blue channel contains the initial logic state image information with the chip select pin held high. The red channel contains the logic state image information with the chip select pin held low. The green channel is obtained by imaging the integrated circuit while toggling the chip select pin at 20 Hz.

Since the red and blue channels contain different fixed logic state information, green cannot appear in a dc mode. Therefore, anything that appears green in the resultant image shown in FIG. 12 must be capacitively coupled to the underlying metal. Orange can only occur as a result of red and oscillating green. The duty cycle will affect the hue between yellow and red. Light blue can only occur as a result of blue and oscillating green. Again, the duty cycle will affect the hue between blue and blue-green (aqua).

Figure 13:
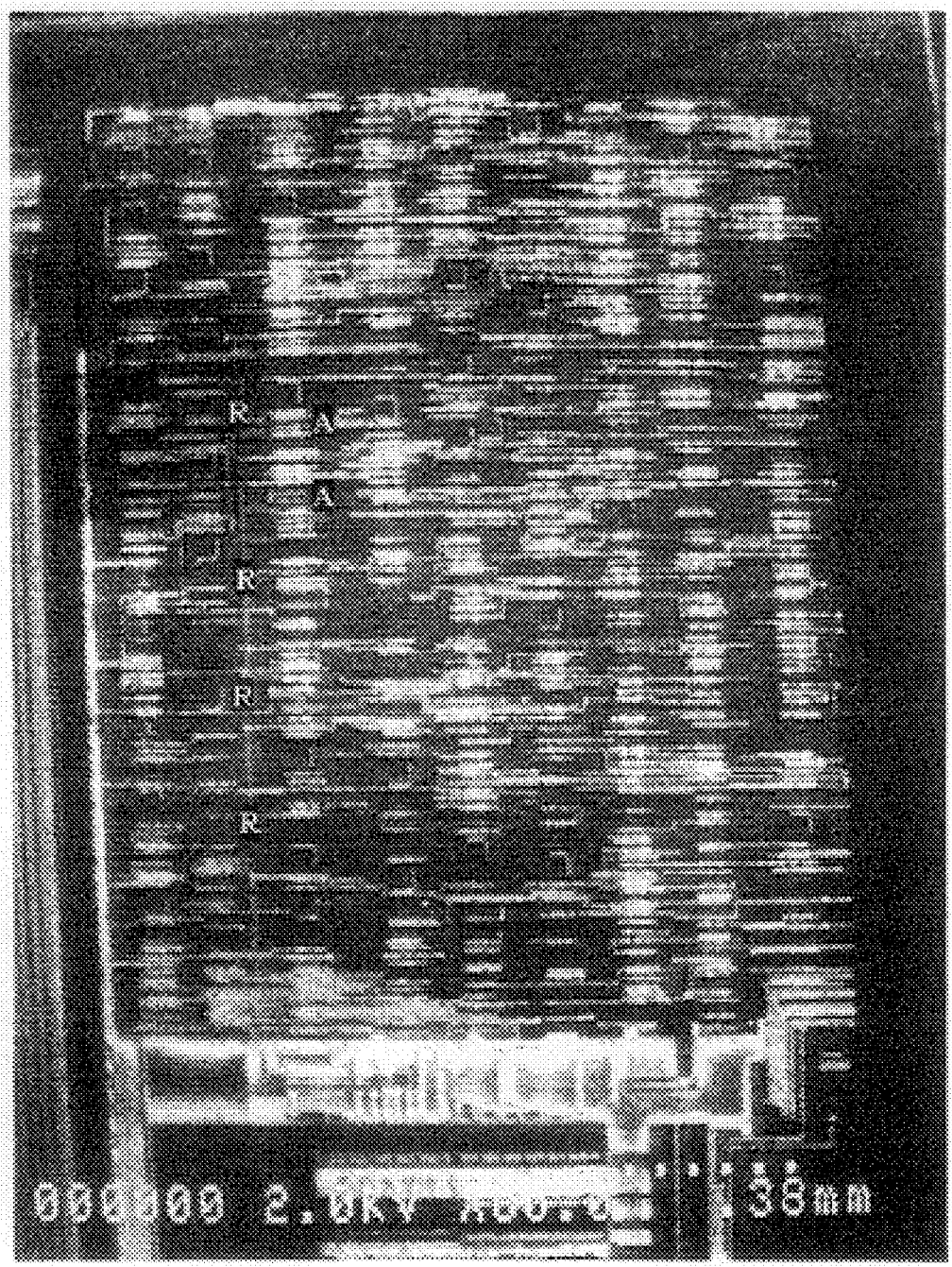
FIG. 13 illustrates an image formed using color convergence alignment with capacitive coupling voltage contrast.

Comparison of a reference integrated circuit and an integrated circuit under test can be accomplished using the color capacitive coupling voltage contrast technique described above (FIG. 12) with color convergence alignment (FIG. 10). The resulting image will clearly show a logic difference in color between the reference integrated circuit and the integrated circuit under test as shown in FIG. 13 ("R"=red, "A"=aqua). Note the vertical red line which indicates a metal node under oxide. Alignment is accomplished while one of the channels is receiving dynamic image information. Slight misalignments due to magnification can be compensated for interactively, revealing only the difference information in color. Any combination of color channels can be used to generate logic state information as well as to discriminate capacitively coupled layers.

Though exemplary color images are not illustrated, it will be apparent that locations of faults in an integrated circuit detected by the emission microscope 102 (FIG. 1) can be made more conspicuous by utilizing the teachings of the present invention. For example, an image of a first integrated circuit known to be free of defects can be stored in one or two channels of the RGB digitizer board 105. Then, an image of a second integrated circuit that might have one or more defects can be aligned with the image(s) of the first integrated circuit and stored in the remaining channel(s). Any differences between the images will indicate a defect in the second integrated circuit and will be highlighted in color.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

In particular, the light tight box may be substituted with a conventional large dark box, or the invention may be used in conjunction with a wafer sorter wherein the rubber boot is coupled directly to the wafer sorter. Further, various lenses, magnification ratios, etc. may be used. Commercially available e-beam testers and digital scanning electron microscopes are capable of image integration for stroboscopic voltage contrast. Pseudo color fault imaging is also available in some cases, however, live imaging is required by live color voltage contrast imaging. The system should be able to update the selected color channel in a live video mode and also allow live zoom and pan functions.

In addition, the invention can be practiced by storing a first image in a first color channel and storing a second image in a second color channel while the third color channel is turned off or otherwise disabled. The resulting combined image will appear in entirely one color while differences between the two images will appear in a contrasting color. For example, if the first channel is green and the second channel is red, the image will appear to be yellow where the images are the same and differences due to logic states, defects or misalignment will be highlighted in green or red.

What is claimed is:

1. A method of detecting differences between two images comprising the steps of:
   a. acquiring a first image;
   b. coupling the first image to a first color channel of a display having three color channels, the first color channel for representing a first color;
   c. acquiring a second image;
   d. coupling the second image to a second color channel of the display, the second color channel for representing a second color; and
   e. coupling one of the first or second image to a third color channel of the display, the third color channel for representing a third color whereby differences between the first image and the second image are highlighted in one of the first color, the second color and the third color and whereby portions of the first image and the second image having no differences are displayed in a black and white format because all color channels for the display are used.

2. A method of detecting failures in an integrated circuit comprising the steps of:
   a. acquiring a first voltage contrast image of an integrated circuit operating under a first set of conditions;
   b. coupling the first voltage contrast image to a first color channel;
   c. acquiring a second voltage contrast image of the integrated circuit operating under second set of conditions;
   d. coupling the second voltage contrast image to a second color channel;
   e. acquiring a third voltage contrast image of the integrated circuit operating under a third set of conditions;
   f. coupling the third voltage contrast image to a third color channel whereby differences between the first voltage contrast image, the second voltage contrast image, and the third voltage contrast image are highlighted in color and whereby portions of the first voltage contrast image, the second voltage contrast image, and the third voltage contrast image having no differences are displayed in a black and white format.

3. The method according to claim 2 wherein any of the first set of operating conditions, the second set of operating conditions and the third set of operating conditions may be equal to each other.

4. The method according to claim 2 wherein any of the first set of operating conditions, the second set of operating conditions and the third set of operating conditions may change dynamically forming a dynamic voltage contrast image.

5. The method according to claim 2 further comprising the step of aligning the first voltage contrast image, the second voltage contrast image and the third voltage contrast image.

6. The method according to claim 2 further comprising the steps of:
   a. forming a combined image by combining the first voltage contrast image, the second voltage contrast image and the third voltage contrast image; and
   b. displaying the combined image.

7. A method of detecting failures in an integrated circuit comprising the steps of:
   a. acquiring a first voltage contrast image of a first integrated circuit operating under a first set of conditions;
   b. coupling the first voltage contrast image to a first color channel;
   c. acquiring a second voltage contrast image of the first integrated circuit operating under second set of conditions;
   d. coupling the second voltage contrast image to a second color channel;
   e. acquiring a third voltage contrast image of a second integrated circuit operating under a third set of conditions;
   f. coupling the third voltage contrast image to a third color channel whereby differences between the first voltage contrast image, the second contrast voltage image, and the third voltage contrast image are highlighted in color and whereby portions of the first voltage contrast image, the second voltage contrast image, and the third voltage contrast image having no differences are displayed in a black and white format.

8. The method according to claim 7 wherein any of the first set of operating conditions, the second set of operating conditions and the third set of operating conditions may be equal to each other.

9. The method according to claim 7 wherein any of the first set of operating conditions, the second set of operating conditions and the third set of operating conditions may change dynamically forming a dynamic voltage contrast image.

10. The method according to claim 7 further comprising the step of aligning the first voltage contrast image, the second voltage contrast image and the third voltage contrast image.

11. The method according to claim 7 further comprising the steps of:
   a. forming a combined image by combining the first voltage contrast image, the second voltage contrast image and the third voltage contrast image; and
   b. displaying the combined image.

12. A method of detecting failures in an integrated circuit comprising the steps of:
   a. acquiring a first fault contrast image of an integrated circuit operating under a first set of conditions;
   b. coupling the first fault contrast image to a first color channel;
   c. acquiring a second fault contrast image of the integrated circuit operating under second set of conditions;
   d. coupling the second fault contrast image to a second color channel;
   e. acquiring a third fault contrast image of the integrated circuit operating under a third set of conditions;
   f. coupling the third fault contrast image to a third color channel whereby differences between the first fault contrast image, the second fault voltage image, and the third fault contrast image are highlighted in color and whereby portions of the first fault contrast image the second fault contrast image, and the third fault contrast image having no differences are displayed in a black and white format.

13. The method according to claim 12 wherein any of the first set of operating conditions, the second set of operating conditions and the third set of operating conditions may be equal to each other.

14. The method according to claim 12 wherein any of the first set of operating conditions, the second set of operating conditions and the third set of operating conditions may change dynamically forming a dynamic fault contrast image.

15. The method according to claim 12 further comprising the step of aligning the first fault contrast image, the second fault contrast image and the third fault contrast image.

16. The method according to claim 12 further comprising the steps of:
   a. forming a combined image by combining the first fault contrast image, the second fault contrast image and the third fault contrast image; and
   b. displaying the combined image.

17. A method of detecting failures in an integrated circuit comprising the steps of:
   a. acquiring a first fault contrast image of a first integrated circuit operating under a first set of conditions;
   b. coupling the first fault contrast image to a first color channel;
   c. acquiring a second fault contrast image of the first integrated circuit operating under second set of conditions;
   d. coupling the second fault contrast image to a second color channel;
   e. acquiring a third fault contrast image of a second integrated circuit operating under a third set of conditions;
   f. coupling the third fault contrast image to a third color channel whereby differences between the first fault contrast image, the second fault contrast image, and the third fault contrast image are highlighted in color and whereby portions of the first fault contrast image, the second fault contrast image, and the third fault contrast image having no differences are displayed in a black and white format.

18. The method according to claim 17 wherein any of the first set of operating conditions, the second set of operating conditions and the third set of operating conditions may be equal to each other.

19. The method according to claim 17 wherein any of the first set of operating conditions, the second set of operating conditions and the third set of operating conditions may change dynamically forming a dynamic fault contrast image.

20. The method according to claim 17 further comprising the step of aligning the first fault contrast image, the second fault contrast image and the third fault contrast image.

21. The method according to claim 17 further comprising the steps of:
   a. forming a combined image by combining the first fault contrast image, the second fault contrast image and the third fault contrast image; and
   b. displaying the combined image.

22. An apparatus for detecting failures in an integrated circuit comprising:
   a. a microscope for forming a microscope image of the integrated circuit, the microscope image including information representative of a first condition of the integrated circuit;
   b. a camera for forming a camera image coupled to receive the microscope image from the microscope; and
   c. an image processor coupled to receive the camera image from the camera, the image processor having three color channels wherein the camera image is selectively coupled to one or two of the three color channels and wherein a second image representative of a second condition of the integrated circuit is coupled to the remaining channels of the three color channels whereby differences between the camera image and the second image are highlighted in color and whereby portions of the camera image and the second image having no differences are displayed in a black and white format.

23. The apparatus according to claim 22 wherein the condition of the integrated circuit is a logic level of a node.

24. The apparatus according to claim 22 wherein the condition of the integrated circuit is a defect in the integrated circuit wherein the defect emits photons.

25. The apparatus according to claim 22 wherein the condition of the integrated circuit is a conductor of the integrated circuit capacitively coupled to an electron beam of the microscope.

26. The apparatus according to claim 22 further comprising a display coupled to the image processor for simultaneously displaying each of the three color channels.

27. An apparatus for detecting failures in an integrated circuit comprising:
   a. a microscope for forming a microscope image of the integrated circuit, the microscope image including information representative of a first condition of the integrated circuit;

b. an image digitizer for forming a digitized image, the image digitizer coupled to receive the microscope image from the microscope; and c. an image processor coupled to receive the digitized image from the camera, the image processor having three color channels wherein the digitized image is selectively coupled to one or two of the three color channels and wherein a second image representative of a second condition of the integrated circuit is coupled to the other remaining channels of the three color channels whereby differences between the digitized image and the second image are highlighted in color and whereby portions of the digitized image and the second image having no differences are displayed in a black and white format.

28. The apparatus according to claim 27 wherein the condition of the integrated circuit is a logic level of a node.

29. The apparatus according to claim 27 wherein the condition of the integrated circuit is a defect in the integrated circuit wherein the defect emits photons.

30. The apparatus according to claim 27 wherein the condition of the integrated circuit is a conductor of the integrated circuit capacitively coupled to an electron beam of the microscope.

31. The apparatus according to claim 27 further comprising a display coupled to the image processor for simultaneously displaying each of the three color channels.

* * * * *